United States Patent [19]

Behrens

[11] Patent Number: 5,453,995
[45] Date of Patent: Sep. 26, 1995

[54] APPARATUS FOR GENERATING TEST SIGNALS

[75] Inventor: Klaus-Peter Behrens, Gaertringen, Germany

[73] Assignee: Hewlett-Packard Company, Palo Alto, Calif.

[21] Appl. No.: 306,723

[22] Filed: Sep. 15, 1994

Related U.S. Application Data

[63] Continuation of Ser. No. 958,224, Oct. 8, 1992, abandoned.

[30] Foreign Application Priority Data

Nov. 11, 1991 [EP] European Pat. Off. ............... 9119189

[51] Int. Cl.⁶ ................................................. G01R 31/28
[52] U.S. Cl. ...................................................... 371/27
[58] Field of Search ........................... 371/27, 15.1, 20.4

[56] References Cited

U.S. PATENT DOCUMENTS

| | | | |
|---|---|---|---|
| 4,538,268 | 8/1985 | Pham Van Cang | 371/27 |
| 4,797,886 | 1/1989 | Imada | 371/27 |
| 4,816,750 | 3/1989 | Van der Kloot et al. | 371/20 |
| 4,835,774 | 5/1989 | Ooshima et al. | 371/25 |
| 4,862,460 | 8/1989 | Yamaguchi | 371/27 |
| 5,050,170 | 9/1991 | Abdoo | 371/27 |
| 5,153,883 | 10/1992 | Hayashi et al. | 371/27 |

FOREIGN PATENT DOCUMENTS 0165865  12/1985  European Pat. Off. .

OTHER PUBLICATIONS

Katoozi, "Built-in Test of CMOS State Machines With Realistic Faults: A System Perspective", IEEE Journal of Solid–State Circuits, 25 (1990) Apr., No. 2, pp. 482–489.

Primary Examiner—Hoa T. Nguyen

[57] ABSTRACT

An apparatus for generating test signals, preferably for use in an integrated circuit tester, comprises a sequencer, a Vector Memory and a Waveform Memory. The Vector Memory is addressed by the sequencer and contains coded waveform information, which is, in turn, decoded into control information by the Waveform Memory. For this purpose, the data outputs of the Vector Memory control the address inputs of the Waveform Memory. The data outputs of the Waveform Memory control circuitry like a formatter or a comparator which link the waveform information with timing information from one or more edge generators. The formatters, comparators etc. are, in turn, in connection with a device under test. The present apparatus provides full flexibility in the generation of formats and waveforms and, in particular, timing and format changes "on the fly", i.e. without additional delay. Flexibility may be increased if the Waveform Memory is reprogammable.

12 Claims, 8 Drawing Sheets

FIG. 5a

| SEQUENCER ADDRESS | | | | | | | | | | | | | | | | |
|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | → t |

FIG. 5b

| WAVEFORM INSTRUCTION | | | | | | | | | | | | | | | | |
|---|---|---|---|---|---|---|---|---|---|---|---|---|---|---|---|---|
| HOLD | HOLD | DRIVE1 | HOLD | HOLD | DRIVE0 | HOLD | DRIVE1 | HOLD | HOLD | DRIVE0 | HOLD | HOLD | HOLD | HOLD | → t |

FIG. 5c

| DATA VECTOR MEMORY | | | | | | | | | | | | | | | | |
|---|---|---|---|---|---|---|---|---|---|---|---|---|---|---|---|---|
| V1 | 1 | 1 | 0 | 1 | 1 | 1 | 0 | 1 | 0 | 1 | 1 | 0 | 1 | 1 | 1 | 1 |
| V0 | 0 | 0 | 1 | 0 | 0 | 0 | 0 | 0 | 1 | 0 | 0 | 0 | 0 | 0 | 0 | 0 | → t |

FIG. 5d

| DATA WAVEFORM MEMORY | | | | | | | | | | | | | | | | |
|---|---|---|---|---|---|---|---|---|---|---|---|---|---|---|---|---|
| W1 | 0 | 0 | 0 | 0 | 0 | 0 | 0 | 0 | 0 | 0 | 0 | 0 | 0 | 0 | 0 | 0 |
| W0 | 0 | 0 | 0 | 0 | 0 | 0 | 1 | 0 | 0 | 0 | 1 | 0 | 0 | 0 | 0 | 0 | → t |

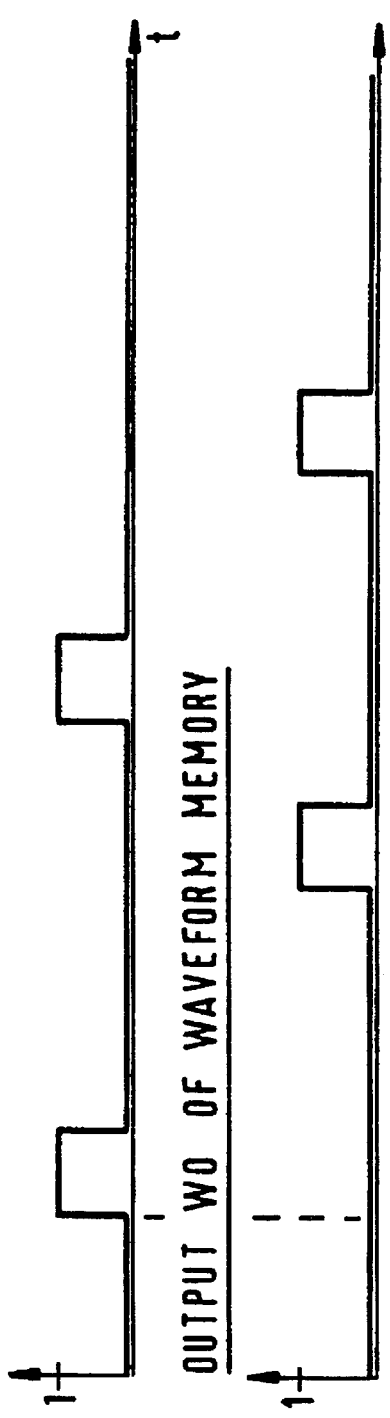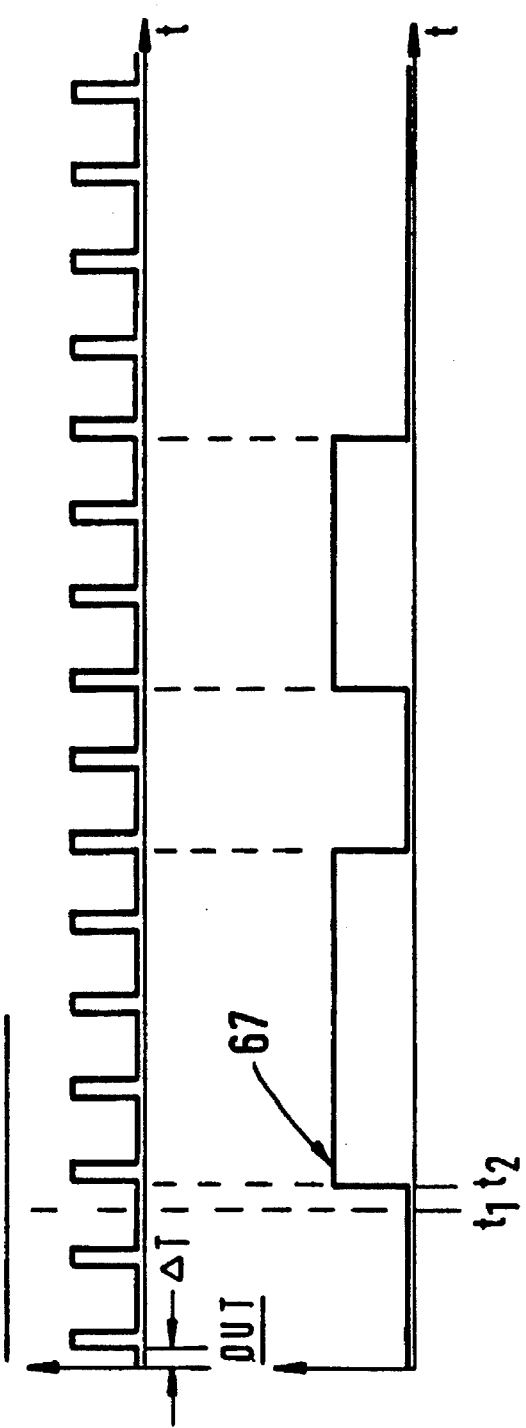

FIG. 7a
FIG. 7b
FIG. 7c
FIG. 7d

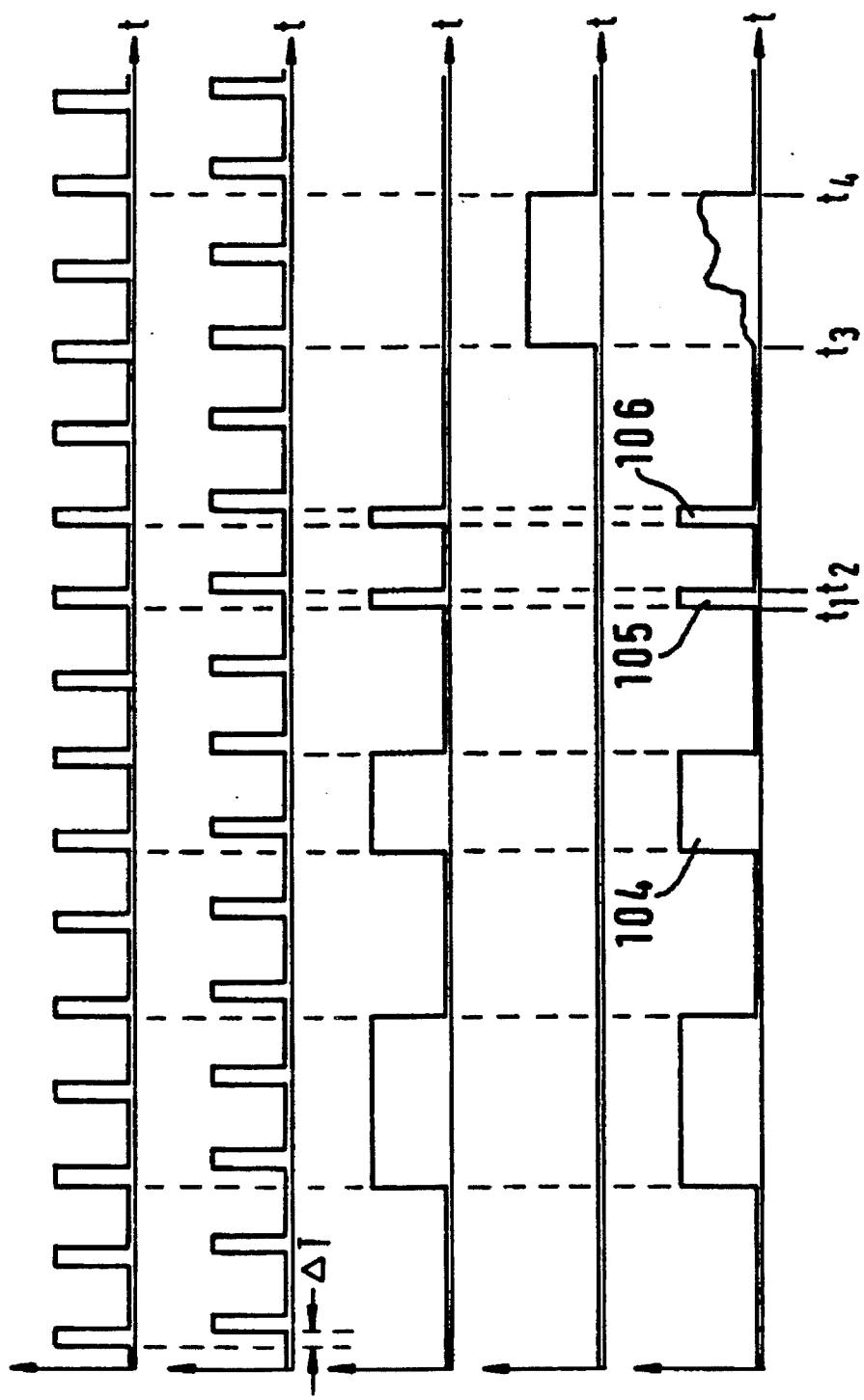

APPARATUS FOR GENERATING TEST SIGNALS

This is a continuation of application Ser. No. 07/958,224 now abandoned filed on Oct. 8, 1992.

FIELD OF THE INVENTION

The present invention relates to an apparatus for generating test signals, and, more particularly, to an integrated circuit tester.

BACKGROUND OF THE INVENTION

One difficulty in integrated circuit tester technology is that the circuits to be tested become more and more complex, not only in terms of pincount, but also in their functionality. That is, the complex logical functions, and in particular the complex timing provided by such integrated circuits (ICs), establishes a need for high-performance IC testers which are able to test the full functionality of IC's in an acceptable time interval.

Prior art IC testers are based on a combined data/timing concept. A first circuit is responsible for the generation of data to be applied to the IC. A second circuit, usually designated as "edge generator", provides very precise timing information, i.e. the design of such edge generators is selected such that the transitions at their outputs are very accurate in time. The data information as well as the timing information are combined (linked) with each other in a third circuit, usually referred to as "formatter", which generates data of the correct waveform and timing for appliance to the device under test (DUT). A formatter of this type is e.g. described in European Patent EP-B-329 798.

The above considerations apply to the generation of test data for the DUT. However, the same concept is used to detect data or signals originating from the DUT: A comparator combines waveforms created by the DUT (in response to the above test data) with timing information of an edge generator. A comparator of this type is disclosed in European Patent EP-B-325 670. It will be noted that the signals labeled as "PStart" and "PStop" in EP-B-329 798 and EP-B-325 670 represent the outputs of various edge generators.

The prior art circuits discussed above allow the generation of various formats and waveforms. For example, the formatter circuit of EP-B-329 798 has a "formatter control" input FC which allows selection between RZ (return to zero) format and RTC (return to complement) format. A "formatter data" (FD) input controls the output.

However, these few possible operating modes may not be sufficient to test ICs with a complex functionality, like new microprocessors, RISC (reduced instruction set) CPUs and their peripheral ICs. Consequently, there is a need for more, partially very complex formats. The prior art circuitry is hard-wired; therefore, the addition of formats, or even a change in the existing formats, is not possible. Of course, one could expand the prior art circuit such that it supports additional formats as well; but this measure would not completely solve the underlying problem, as there might arise a need for even further (and not yet known) formats in the future, and ICs with a very specific functionality and therefore the need for very specific formats could not be taken into account. Last not least, such expansion of the existing hardware would be laborious and expensive.

Another problem of the prior art circuits is that, once a timing has been selected, it cannot be altered from test period to test period without significant delay. On the other hand, the possibility of such change of timing would be desirable, in order to fulfil the timing requirements of some ICs (which cannot be fully tested without such capability), and in order to speed up the test.

One solution for adding the capability of rapid change of timing is to use dynamic edge generators (also called "change timing on the fly" or "CTOF" edge generators) instead of the known static edge generators (which basically produce the same delay in every period). In contrast thereto, CTOF edge generators can be reprogrammed during operation, i.e. "on the fly". However, their use involves a variety of problems (some of which will be discussed in the detailed description). For this purpose, CTOF edge generators are extremely expensive, such that the overall cost of the integrated circuit tester is drastically increased as well. Further, despite the high price of CTOF edge generators, they are still less accurate in timing than static edge generators. This is primarily due to the fact that calibration cannot take care of dynamic errors.

It is understood that, in general, static edge generators may be reprogrammed as well. However, such reprogramming necessitates an interrupt or break cycles, i.e. it does not happen "on the fly". Overall testing time is thus considerably increased, and some ICs requiring a fast response (e.g. at the comparator) cannot be tested to their very limits.

Based on the above considerations, it is a major object of the present invention to provide an apparatus for generating test signals which provides sufficient flexibility in the generation of test patterns (test waveforms). It is a further goal of the invention to provide an apparatus for generating test signals which may be operated without dynamic edge generators.

SUMMARY OF THE INVENTION

A test signal generator incorporating the invention comprises a sequencer for generating address signals and a vector memory for storing test vector signal patterns that define a waveform code or an action code. The vector memory is responsive to an address signal from the sequencer to provide a test vector signal pattern output that corresponds to the address signal. The test signal generator further includes a formatter circuit which provides a format signal to a device under test and receives data signals from a device under test, and an edge signal generator which outputs signal transitions to the formatter circuit that are substantially equidistant in time. A waveform memory, in the test signal generator, includes stored formatter control signals and is responsive to a test vector signal pattern output from the vector memory to output a corresponding formatter control signal. The formatter circuit is responsive to the corresponding formatter control signal to output a format signal upon a coincident application of a signal transition from the edge signal generator.

In an apparatus according to the present invention, a circuit for generating address signals provides basically subsequent addresses. This may be (in a very simple example) a counter under control of a clock signal; in a more sophisticated approach, it is a sequencer which is also able to perform unconditional and conditional jumps and/or branches, perform subroutines etc.

The output of the counter or sequencer is fed to the address inputs of a first memory. This memory, sometimes also referred to as "Vector Memory" contains under every address a "test vector" defining the signal to be applied to the formatter or the comparator, e.g. a transition from 0 to 1, tri-state (HZ) or the like. The Vector Memory has a multiplicity of address lines and addresses (typically, several kilobits—e.g., 32 kbit—to several megabits), but only a few data outputs (typically, 1 to 4 output lines). In other words, it contains a lot of memory cells, but every memory cell contains only 1 to 4 bits. It can therefore also be characterized as "deep, but narrow".

The counter or sequencer generates the addresses for the Vector Memory, typically in subsequent order (at least as long as no branch or the like occurs during operation of the sequencer). The contents of the related memory cells are fed to the data outputs of the Vector Memory.

The data output of the Vector Memory is then fed to a second memory which will be called "Waveform Memory" hereinafter. That is, the data outputs of the Vector Memory are connected with the address inputs of the Waveform Memory. The Waveform Memory can be characterized as "flat, but broad": Typically, it provides only 1 to 4 address inputs (corresponding to the 1 to 4 data outputs of the Vector Memory), but a multiplicity of data outputs (typically 70). In other words, it contains only a few memory cells, but every memory cell contains a multiplicity of bits.

The data outputs of the Waveform Memory are fed to at least one, but preferably several circuits for providing and/or receiving data signals to/from the DUT. In the latter case, every data output line may be fed to a different one of these circuits. The data outputs control operation of the related circuits, as far as the waveform is concerned. Timing control is provided by connecting any of the circuits with one or more edge generators. Such circuits may be, in a preferred embodiment of the invention, a data formatter, a tri-state (HZ) formatter, an edge comparator and/or a window formatter or other circuitry controlling operation of the DUT, like an active load. It will be noted that the controlled circuits may be circuits for providing signals to the DUT (like the data and tri-state formatter), or circuits controlling signals generated by the DUT (like the edge comparator and the window formatter).

To some extent, the Waveform Memory is the "heart" of the present invention. It defines possible waveforms or "actions" for the formatter(s), the comparator(s) etc. It therefore acts as a "translator" which transforms the waveform code (contained in the Vector Memory) into control signals for the formatter(s) etc. This provides both flexibility and a simple and uniform control scheme: An IC tester containing the inventive apparatus may very easily be adapted to other applications by simply replacing the content of or reprogramming the Waveform Memory, such that different formats than originally provided may be generated. Likewise, the signals provided by the Waveform Memory may be used to control a multiplicity of functions; in particular, the circuits applying signals to the DUT, and the circuits receiving data from the DUT are controlled by the same hardware elements, unlike in former applications (due to their limited number of data outputs, former Vector Memories were only able to control a single, or a few, circuits like a formatter, and only in some fixed way or ways. In contrast, the "broad" Waveform Memory allows to control basically all operations at the IC tester/DUT interface).

The inventive apparatus is flexible enough, i.e. allows the generation of such a variety of waveforms, and of waveforms specifically adapted to the DUT, that expensive dynamic edge generators are not required. This is a major advantage over prior art devices. (However, although the edge generators are static edge generators in a preferred embodiment of the invention, it is understood that dynamic edge generators may be used as well, in particular if the above architecture is not provided for every pin of the DUT, but follows a "shared resource" approach instead wherein a few edge generators may be dynamically assigned to different pins.) In particular, the formatters, comparators etc. may be controlled in flexible manner.

Use of a second memory such as the Waveform Memory thus allows to operate an IC tester in modes wherein the timing is changed from test period to test period ("change timing on the fly"), or the format is changed from test period to test period ("change format on the fly"). The changes may even be performed between two subsequent "edges" generated by one or more edge generators. The Waveform Memory defines the drive formats, as well as the receive formats, and their position in time, in dynamic manner. The number of formats required to test the DUT properly, and the required changes "on the fly" determine the "depth" of the Waveform Memory, and therefore the "broadness" of the Vector Memory, as well as the number of required edge generators.

It has to be noted that the above expressions "connected" or "connection" relate to direct connection (=direct galvanic coupling) as well as indirect connection, i.e., via further circuitry. For example, the circuit for generating address signals may be connected with the first memory, or the first memory may be connected with the second memory, or the second memory may be connected with the formatter/comparator circuitry indirectly, i.e., via additional circuits.

Although the invention may be practiced with one edge generator only, it is advantageous to have several (preferably static) edge generators available. These edge generators may be used to create more complex waveforms. As their time delay with respect to each other may be adjusted in independent manner, very small (several picoseconds) as well as broad pulses may be generated.

A major advantage of the present invention is that it provides "upward compatibility" with prior art IC testers. In fact, an IC tester containing the inventive apparatus is able to emulate all known IC testers with the same or less resources.

In a commercial IC tester, the apparatus will usually be incorporated multiple times. This is because it is desirable to test several pins of the DUT simultaneously, in order to shorten the required test time.

It will be appreciated that, although the invention has been described with particular reference to an IC tester heretofore, its concept may be applied equally well to a memory tester, a board tester, a wafer tester etc. The skilled man will be aware of further applications where the concept of the present invention may be useful. Therefore, the reference to an IC tester is made for exemplary purposes only.

The first memory means, called "Vector Memory" above, may comprise complex elements generating an address sequence. Therefore, its concept may even be expanded to an algorithmic pattern generator, i.e. a computer which generates the required addresses. This is one preferred embodiment of the present invention.

In another preferred and most advantageous embodiment, said second memory means is programmable, in particular electrically reprogrammable (such as an EEROM, a Flash EPROM or a RAM). That is, the second memory (Waveform Memory) is reprogrammable by the user (and/or during operation). This important feature ensures full flexibility under all circumstances, as the user may program even very specific or very rare formats, or even formats which were not known at the point in time when the IC tester was manufactured.

As already outlined above, the waveform information is fed to a formatter, comparator or the like, which combines or links the waveform data with the transition or the state of an edge generator. In a preferred embodiment, the output signal of the Waveform Memory is fed—directly or indirectly—to the input of a flip-flop. This flip-flop may be of the RS type, or an edge-triggered T flip-flop, or any other suitable flip-flop. For further details of signal processing to or from the DUT, in particular the circuitry of a formatter, reference is made to European patent application No . . . EP A 541 840, the contents of which are hereby incorporated into the present disclosure by reference.

The waveform memory is preferably integrated together with the formatters, comparators etc. Therefore the manufacturing cost of an IC tester incorporating the inventive apparatus is hardly increased, compared to conventional IC testers.

Although the inventive apparatus has been disclosed and described in an application for an IC tester above, it is understood that it may be advantageously used in other, comparable applications as well.

Further features and advantages of the present invention will be apparent from the following detailed description.

DESCRIPTION OF THE DRAWINGS

The invention will now be explained, by means of a non-limiting example, with reference to the accompanying drawings, in which:

FIGS. 5a–h are timing diagrams illustrating operation of the circuit of FIG. 4, FIGS. 7a–7i are timing diagrams illustrating operation of the circuit of FIG. 6.

DETAILED DESCRIPTION OF THE INVENTION

Figure 1:
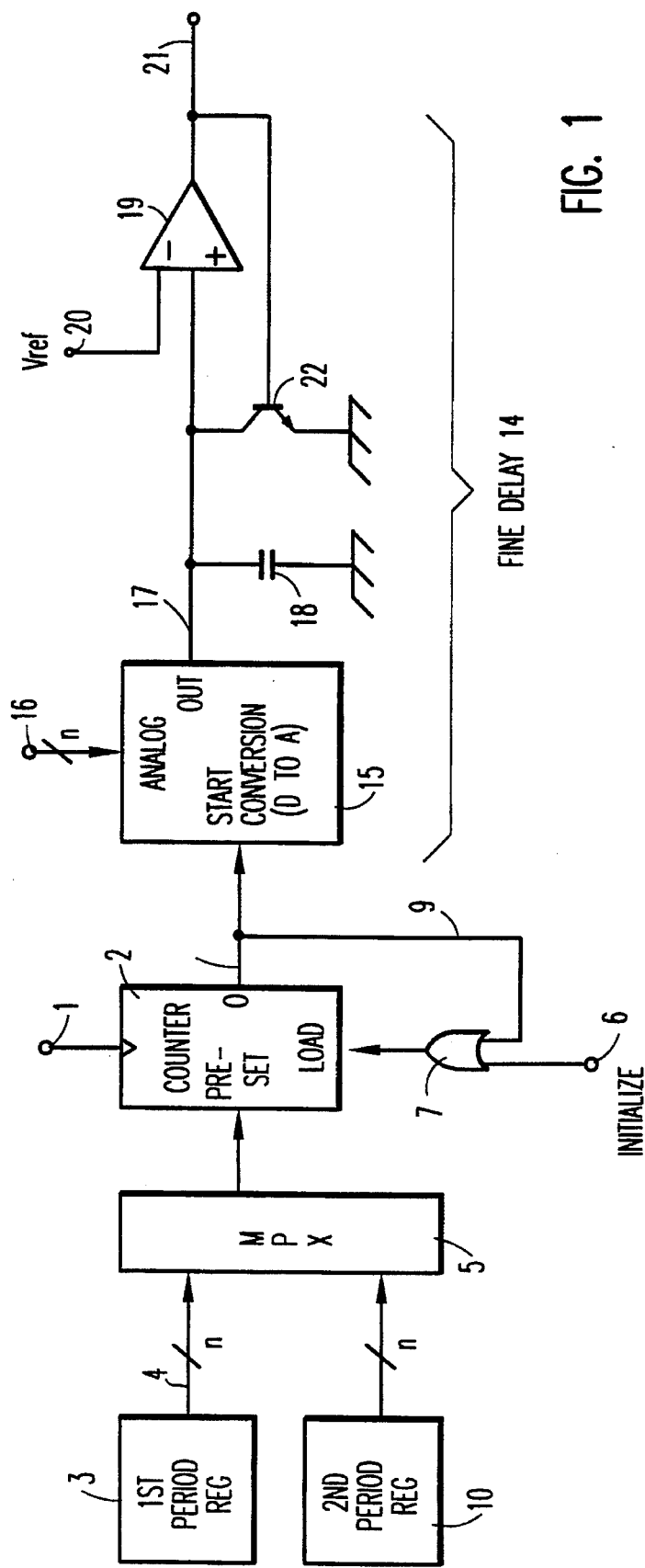
FIG. 1 depicts the basic circuitry of a static edge generator, in order to illustrate the problems arising from rapid changes in timing.

FIG. 1 depicts (in simplified manner) the circuitry of a static edge generator used in integrated circuit testers. A master clock pulse (reference number 1) is fed to the clock input of a down counter 2, i.e. a counter which counts from a preset value to zero and generates an output signal if that happens.

The initial counter value is preset by a period register 3 the outputs of which are connected—via line 4 and a multiplexer 5—with the preset inputs of down counter 2 (it will be appreciated that a multiplicity of connection lines is needed therefor, as indicated by the character n).

As soon as a "Initialize" signal is supplied to input 6 (and from there, via OR-gate 7, to the "Load" input of down counter 2), the down counter counts from the preset value to zero and generates an output pulse on line 8 if that happens. The output signal is fed back (line 9)—via OR-gate 7—to the "Load" input of down counter 2, which in turn initiates a new counting cycle.

In case it is desired to shift the entire output sequence ("coarse delay"), down counter 2 is initially loaded via a second period register 10, whose output is fed via multiplexer 5 to the "preset" input of the down counter. That is, in a first cycle, the counter starts counting at another value than in subsequent cycles (when it is preset via period register 3). Therefore, the start of a counting cycle may be shifted as required. Control of period registers 3 and 10 is well-known in the art and therefore not shown in FIG. 1

Figures 2A, 2B, 2C, 2D:
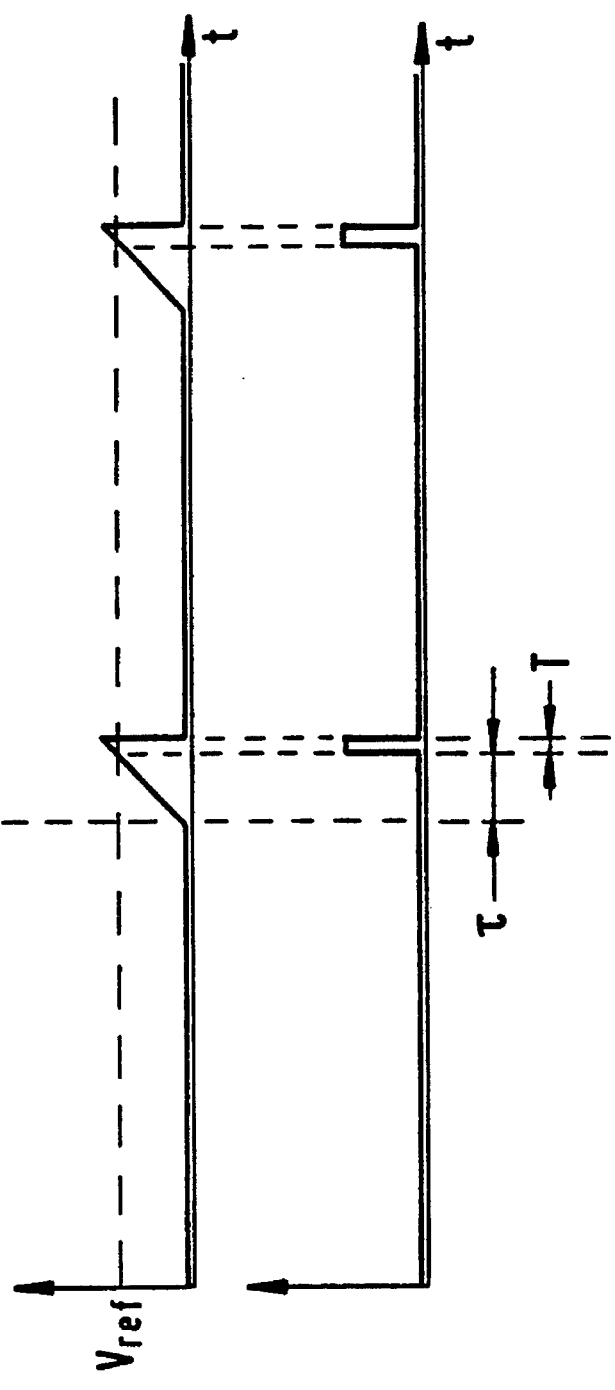
FIG. 2 is a timing diagram of the circuit in FIG. 1.

Operation of the circuit, as described up to now, is illustrated by FIGS. 2a and 2b. FIG. 2a is the timing diagram of the master clock pulse fed to the clock input of down counter 2. In the given example, the preset value has been selected as 2. Second period register 10 is not used in this example.

In the timing diagram of FIG. 2b, which illustrates the output signal on line 8, it will be noted that the first two master clock pulses 11a and 11b do not cause any pulse signal. However, with the trailing edge of master clock pulse 11c, an output pulse 12 is generated. This output pulse is fed back to the "Load" input of down counter 2, which initiates a new counting cycle. Thus, after occurrence of two further master clock pulses 11d and 11e, master clock pulse 11f causes a further output pulse 13 to occur.

The circuitry consisting of components 2 and 3 (FIG. 1) may be used to perform—in dependence of the preset value—any required frequency division of the master clock pulse, in order to generate different periods. However, in order to adapt the edge pulses to the specific requirements of a circuit to be tested, an adjustable time shift has to be provided as well. This function is performed by fine delay stage 14.

The major component of fine delay stage 14 is a digital-to-analog converter 15. A digital value—which represents the required time shift—is fed to n digital inputs 16. The output of down counter 2 is likewise fed to the "Start Conversion" input of the DAC.

As soon as down counter 2 has counted to zero, the generated signal pulse will start the conversion of DAC 15. The analog output voltage appearing on line 17 charges capacitor 18. That is, the voltage at the non-inverting input of a comparator 19 ramps up, wherein the slope (i.e. the gradient of the ramp) is defined by the applied analog output voltage of DAC 15. As soon as the ramp-up voltage reaches a level which exceeds a predefined reference voltage $V_{ref}$ applied to the inverting input of comparator 19 on line 20, a transition is observed in the output line 21 of comparator 19. This is a transition from zero to the maximum output voltage of the comparator.

The (positive) output voltage on line 21 is, in turn, fed back to the base of a transistor 22. This transistor, which has been blocked before, becomes now conductive by means of the output pulse of the comparator, and thus discharges capacitor 18 rapidly. The voltage at the non-inverting input of comparator 19 falls "instantaneously" below the reference voltage level, such that the output of comparator 19 returns to zero, and transistor 22 turns off.

The voltage at the non-inverting input of comparator 19, i.e. on line 17, is depicted in FIG. 2c. It will be noted that the ramp-up voltage starts as soon as DAC 15 produces a (positive) output signal, and that an output pulse (line 21, illustrated in FIG. 2d) starts as soon as the ramp-up voltage crosses the reference level $V_{ref}$.

The output pulse on line 21 has a very short duration T. Further, due to the time necessary for the voltage at the non-inverting input of comparator 19 to ramp-up, it is delayed—with reference to the signal on line 8—by a time delay τ (also indicated in FIG. 2d).

The static edge generator shown in FIG. 1 can thus be used to generate pulses with a frequency which is an integer part of the master clock frequency (dependent on the preset value stored in period register 3), and with any desired delay (as defined by the digital input of DAC 15). However, it will be appreciated that reprogramming of the static edge generator is impossible "on the fly", i.e. during operation, without interrupts or break cycles. This is because some time is needed to apply a new period value to period register 3 and down counter 2, and likewise to apply a new delay value to the digital input of DAC 15. Further, these signals must be allowed to settle.

A further problem arises if down counter 2 has already counted some master clock cycles when the inquiry for a new preset value occurs. In this case, the down counter has to be restarted, but—as some clock pulses have already been counted—a difference between the counted pulses and the final number of pulses to count has to be calculated. This requires a difference calculation for the transitional period. After the transitional period, the new preset value has to be established, such that a total of two steps is necessary. It will be appreciated that such operation requires a very complex logic and a counter with additional capabilities.

Another problem is that the digital input to DAC 15, and/or the reference voltage level, have to be shifted from period to period. Due to the occurring transients, a very fast and thus expensive digital-to-analog converter has to be used.

Yet another problem when reprogramming an edge generator "on the fly" is that static calibration cannot take care of dynamic errors. This results in timing errors and therefore in reduced accuracy of the edge generator.

It will be apparent from the above explanations that dynamic edge generators are very complex and expensive, but still provide less precise operation than a static edge generator. Therefore, it would be desirable to use static edge generators even in a "change timing on the fly" concept.

Figure 3:
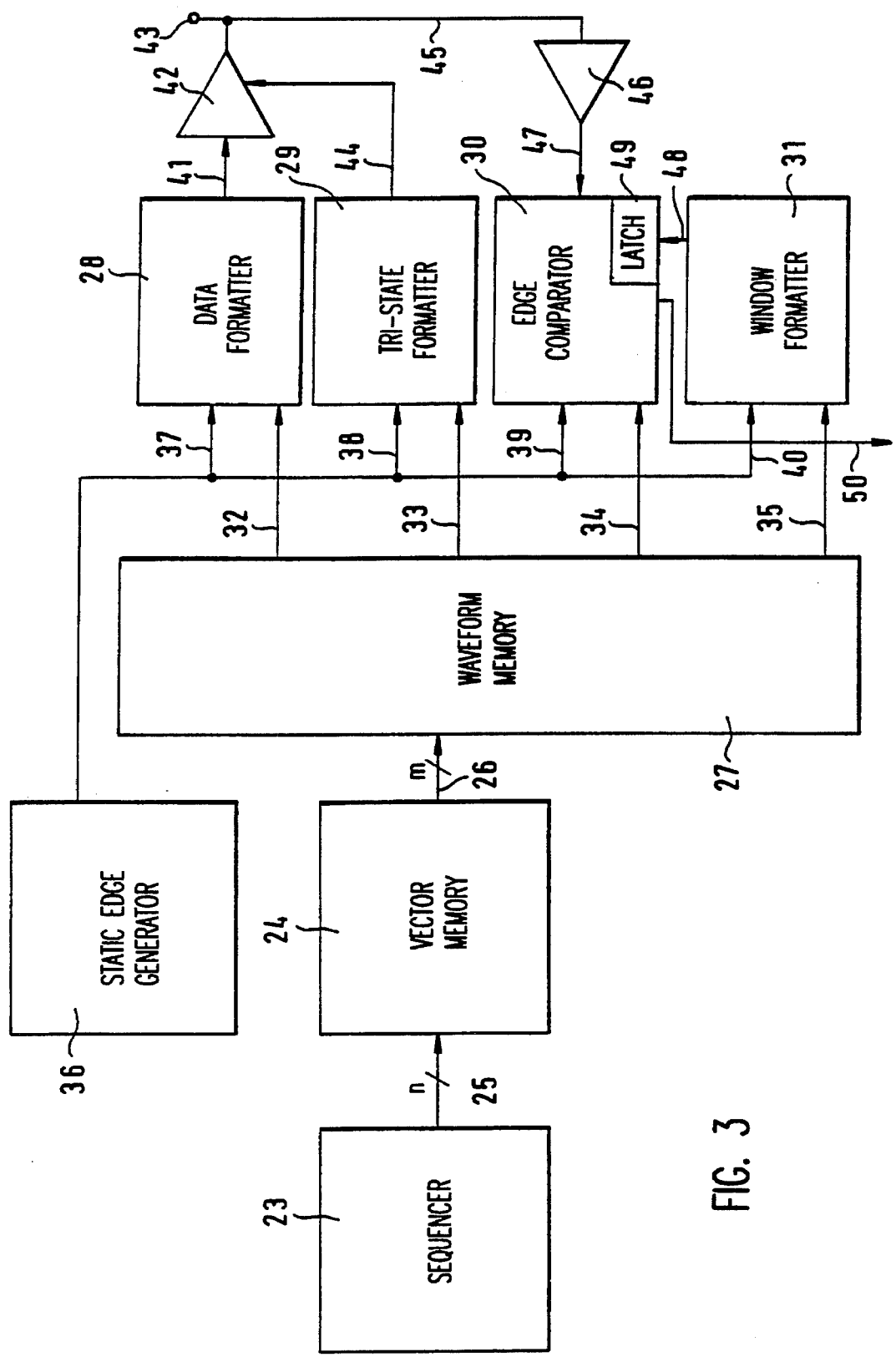
FIG. 3 is a block diagram of an embodiment of the present invention.

The basic block diagram of an apparatus for an integrated circuit tester which fulfills the above needs is shown in FIG. 3.

A sequencer is labelled as 23. This sequencer is basically a counter which feeds addresses to a Vector Memory 24. The addresses applied via lines 25 are increased by 1 from step to step; however, the sequencer 23 is also able to perform conditional and unconditional jumps and branches, execute subroutines, stop operation etc.

Vector Memory 24 contains, for each address, a specific waveform code or action code, like "drive 1" or "compare 0". These are actions to be performed with an integrated circuit under test (device under test=DUT). Various actions or waveforms will be discussed in detail below.

The number of possible actions or waveforms is limited; therefore, Vector Memory 24 has only few data output lines. For example, the number of data outputs could be m=4 (line 26). On the other hand, the Vector Memory must be able to generate long test sequences, or to store various test sequences; this is the reason why a multiplicity of address inputs are provided. Typical examples are between n=15 (which corresponds to 32 k addresses) and n=22 (which corresponds to 4 Mbit addresses), see line 25. Vector Memory 24 is usually re-programmable, such that other test sequences may be loaded.

The data outputs of Vector Memory 24 are connected (line 26) with the address inputs of a Waveform Memory 27. This memory decodes the waveform codes or action codes from Vector Memory 24 into control signals which can be fed to a multiplicity of circuits which are connected with the device under test (DUT). In the given example, these circuits are a data formatter 28, a tri-state formatter 29, an edge comparator 30 and a window formatter 31. It will be appreciated that other circuits controlling operation of the DUT, like an active load, may be connected with the outputs of Waveform Memory 27 as well.

In contrast to Vector Memory 24, Waveform Memory 27 has only few address inputs (typically, m=4), but a multiplicity of data outputs (typically 70). Therefore, the block diagram of FIG. 3 shows only a minority of the typical data outputs in a practical application.

The data outputs of Waveform Memory 27 are fed to data formatter 28, tri-state formatter 29, edge comparator 30 and window formatter 31 via connection lines 32, 33, 34 and 35. The waveform information (control information) transmitted over these lines is combined (linked) with a timing signal from a static edge generator 36. The output signal of this edge generator is fed via lines 37 to 40 to units 28 to 31. For example, data formatter 28 links the waveform information obtained via line 32 with the timing information received via line 37. It will be understood that, in more sophisticated applications, a multiplicity of edge generators 36 is used, such that even very complex waveforms may be generated.

Waveform Memory 27 is electrically re-programmable, such that every user may define the waveforms (actions) required for his specific application. This ensures, together with several edge generators, sufficient flexibility of the IC tester. Further, the timing may be changed from period to period between the edge generators ("change timing on the fly"), or the format may be changed from cycle to cycle ("change format on the fly"), such that edge generator 36 may be a (simple and inexpensive) static edge generator.

Data formatter 28 is connected—line 41—with a driver circuit 42, the output of which is in electrical contact with a pin of the device under test (see pin 43). It controls the waveform of signals applied to, i.e. transmitted to the DUT. Tri-state formatter 29 controls (line 44) the output of driver circuit 42, i.e. a logical "0" on line 44 causes driver 42 to transmit the signal received on line 41, whereas a logical "1" on line 44 causes driver 42 to enter its high-impedance (HZ) output state. Both formatters 28 and 29 are thus used to control the voltage level applied to a pin of the DUT (reference number 43).

However, Waveform Memory 27 does not only control "transmit" elements 28 and 29, but "receive" elements 30 and 31 as well. A signal originating from the DUT is fed—line 45—to a buffer 46, which—in turn—is connected with edge comparator 30 (line 47). The edge comparator determines, depending on the contents of waveform memory 27, if the signal from the DUT is the expected signal at a specific point in time. It can also be detected whether the signal from the DUT has the expected value for a certain amount of time.

In order to perform this function, window formatter 31 is provided. The window formatter transmits the window signals via line 48 to a latch 49 integrated in edge comparator 30. In case the comparison fails, an error signal is generated on line 50. For more details of the comparator and window formatter circuits, reference is e.g. made to European patent EP-B-325 670.

Typical waveforms (actions) encoded in Waveform Memory 27 are e.g.:

a) transmit actions:
  *Drive 0
  *Drive 1
  *Drive HZ (tri-state)
  *Hold
  *Toggle;

b) receive actions:
  *Compare 0
  *Compare 1
  *Compare I
  *Compare X
  *Window open
  *Window close A simplified example of operation will now be given by means of FIGS. 4–8. It should be noted that this example has been chosen to explain the basics of the present invention only, and that a commercial IC tester would use a more sophisticated approach.

Figure 4:
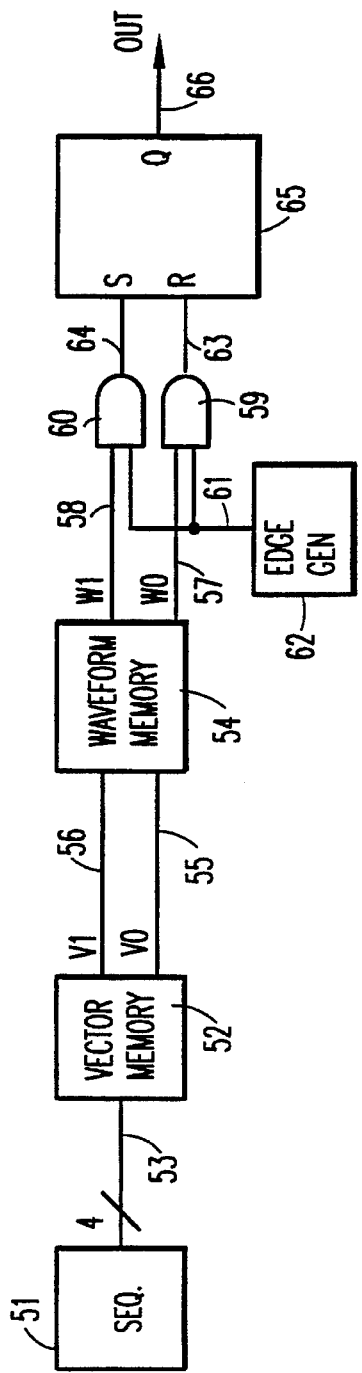
FIG. 4 depicts the required circuitry for a simplified embodiment of the invention—this example has only been selected for the purpose of illustration of operation and would not be used in a commercial high-performance IC tester.

In FIG. 4, the sequencer is denoted as 51 and connected with a Vector Memory 52 via four address lines 53. The outputs of Vector Memory 52 (data outputs) are connected with the address inputs of Waveform Memory 54 via two connection lines 55 and 56 labelled as "V0" and "V1" in this drawing.

Waveform Memory 54 has two data output lines 57 and 58 labelled as "W0" and "W1". It should be noted that a waveform memory with the same number of input lines and output lines (as is the case in FIG. 4) would be quite unusual in a practical application—as the waveform memory is flat, but broad, it would typically comprise only few address input lines, but a multiplicity of data outputs (e.g. 70 data output lines). The fact that Waveform Memory 54 in FIG. 4 has the same number of inputs as outputs results from the simplified environment shown in this figure.

Data output lins 57 and 58 of Waveform Memory 54 are each fed to the inputs of two AND gates 59 and 60. The other inputs of AND gates 59 and 60 receive a timing signal (line 61) of an edge generator 62. The outputs of the two AND gates are connected (lines 63 and 64) with the "Reset" and "Set" inputs of a RS flip-flop 65, respectively. The Q output of RS flip-flop 65 constitutes an output signal OUT (line 66).

In the example of FIG. 4, RS flip-flop 65 serves as a (very simple) data formatter. It will be appreciated that other types of flip-flops, e.g. T flip-flops or the like, may be used as well and that the shown RS flip-flop is of exemplary character only. For ease of description, the tri-state formatter and the receiver components (edge generator, window formatter) have not been shown in FIG. 4.

The simplified example of this circuit is able to support three waveforms or actions, namely to drive the output signal to logical 0 ("Drive 0"), to drive the output signal to logical 1 ("Drive 1") and to keep the output signal constant ("Hold"). A coding table for these three waveforms is shown in Table 1; e.g., the waveform or action "Drive 1" is coded as "01". It is understood that this coding table is nowhere stored in the circuit of FIG. 4, but serves as a reference for the programmer only.

Vector Memory 52 holds, in each memory cell, one of the waveform codes of Table 1. If its addresses are subsequently selected by sequencer 51, the contents of the memory cells are also subsequently applied to lines 55 and 56. In the given example, the lower bit V0 of a memory cell is applied to line 55, and the higher bit V1 to line 56.

TABLE 1

| CODING TABLE | | |
|---|---|---|
| WAVEFORM | CODE | |
| DRIVE 0 | 0 | 0 |
| DRIVE 1 | 0 | 1 |
| HOLD | 1 | 0 |

Table 2 shows a very simple example of the contents of Vector Memory 52. It is understood that these contents define the output signal OUT for a specific sequence; i.e. in order to generate another test sequence, the Vector Memory has to be loaded with different contents. Under each address (leftmost column in Table 2), a specific waveform code may be found in the associated memory cell (designated as "Data" in the middle column of Table 2). For ease of reference, the meaning of the waveform code has further been listed in the rightmost column.

TABLE 2

| VECTOR MEMORY | | | | | | |
|---|---|---|---|---|---|---|
| ADDRESS | | | | DATA | | (WAVEFORM) |
| 0 | 0 | 0 | 0 | 1 | 0 | HOLD |
| 0 | 0 | 0 | 1 | 1 | 0 | HOLD |
| 0 | 0 | 1 | 0 | 0 | 1 | DRIVE 1 |
| 0 | 0 | 1 | 1 | 1 | 0 | HOLD |
| 0 | 1 | 0 | 0 | 1 | 0 | HOLD |
| 0 | 1 | 0 | 1 | 1 | 0 | HOLD |
| 0 | 1 | 1 | 0 | 0 | 0 | DRIVE 0 |
| 0 | 1 | 1 | 1 | 1 | 0 | HOLD |
| 1 | 0 | 0 | 0 | 0 | 1 | DRIVE 1 |
| 1 | 0 | 0 | 1 | 1 | 0 | HOLD |
| 1 | 0 | 1 | 0 | 1 | 0 | HOLD |
| 1 | 0 | 1 | 1 | 0 | 0 | DRIVE 0 |
| 1 | 1 | 0 | 0 | 1 | 0 | HOLD |
| 1 | 1 | 0 | 1 | 1 | 0 | HOLD |
| 1 | 1 | 1 | 0 | 1 | 0 | HOLD |
| 1 | 1 | 1 | 1 | 1 | 0 | HOLD |

Take for example the third row in the table of Table 2. The address is "0010" which corresponds to a "2" in decimal notation. The memory cell with this address contains the waveform code "01" which corresponds to the waveform or action "Drive 1", cf the second row of Table 1.

The data outputs V0 and V1 of Vector Memory 52 constitute the address inputs of Waveform Memory 54. The contents of this memory are shown in Table 3. The Waveform Memory decodes the waveform codes received from the Vector Memory into control signals, in this case to control signals W0 and W1 fed to AND gates 59 and 60.

TABLE 3

| WAVEFORM MEMORY | | | |
|---|---|---|---|
| ADDRESS | | DATA | |
| 0 | 0 | 0 | 1 |
| 0 | 1 | 1 | 0 |
| 1 | 0 | 0 | 0 |

In the given example, the waveform code "00"—which corresponds to a "Drive 0" instruction—is decoded into "01" as control signals. That is, W0=1 and W1=0, such that AND gate 59 produces a "1" at its output as soon as edge generator 62 delivers a "1" signal as well. The truth table of flip-flop 65 is as follows:

| S | R | $Q^{n+1}$ |
|---|---|---|
| 0 | 0 | $Q^n$ |
| 0 | 1 | 0 |
| 1 | 0 | 1 |
| 1 | 1 | — | such that a "1" signal on line 63 will reset the flip-flop, i.e. its Q output (line 66) will be 0. This is exactly the "Drive 0" operation.

Similar consideration apply to the other waveforms. For example, a "Drive 1" instruction ("01" at the output of Vector Memory 52) produces a "10" pattern at the output of Waveform Memory 54, i.e. W1=1 and W0=0. This pattern sets RS flip-flop 65 and thus drives its Q output to "1". The "Hold" instruction causes Waveform Memory 54 to produce a "00" pattern which keeps RS flip-flop 65 in its previous state.

It will be appreciated that the contents of Waveform Memory 54 may be altered (reprogrammed) in case other actions or waveforms are required, or in case the definition of the waveforms (Table 1) should be changed.

Operation of the circuit of FIG. 4 will now be explained by means of FIGS. 5a–5h. FIG. 5a depicts the addresses sequentially applied by a sequencer 51 to the address inputs of Vector Memory 52, wherein the horizontal axis indicates time. For the purpose of easy illustration, the addresses have been denoted in decimal, not in binary digits.

In response to the applied address, Vector Memory 52 generates the data outputs V0 and V1 depicted in FIG. 5c. In order to increase intelligibility, the meaning of the associated waveform code has further been listed in FIG. 5b. For example, the appliance of the address "6" causes Vector Memory 52 to output the waveform code "00" which corresponds to the command "Drive 0".

The data output of Vector Memory 52 is applied to the address inputs of Waveform Memory 54. The data output produced by this memory in response to the waveform codes applied to its address inputs is shown in FIG. 5d. In the above example where the Vector Memory had generated the output "00" in response to the appliance of address "6", the Waveform Memory would generate the pattern "01", i.e. W1=0 and W0=1, at its output in order to reset RS flip-flop 65.

The outputs of the Waveform Memory are further shown, in analog diagrams, in FIGS. 5e and 5f. It will be noted that the amplitude of the waveform shown in FIG. 5e is always "1" when the digital value W1 in FIG. 5d depicts a "1", and "0" otherwise. The same applies to the diagram of FIG. 5f which is the analog representation of output signal W0 of Waveform Memory 54.

FIG. 5g depicts a timing diagram of the signal generated by edge generator 62 and fed to the inputs of AND gates 59 and 60. It will be noted that the edge generator signal is delayed, with respect to the signals generated by Waveform Memory 54, for an amount $\Delta T$, in order to allow the waveform signal to settle.

AND gates 59 and 60 combine the waveform information received from Waveform Memory 54 with the timing information from edge generator 62 and control the S and R inputs of RS flip-flop 65. The result of this operation, namely the output signal OUT on line 66, is depicted in FIG. 5h. It will be noted that, if an output of the Waveform Memory (FIGS. 5e and 5f) is "1", and a "1" state of the edge generator occurs, RS flip-flop 65 will be set to the appropriate state, (i.e., either Set or Reset). For example, see what happens when the sequencer address is equal to 2. In this case, the "Drive 1" ("01") instruction of Vector Memory 52 is decoded into the control signals "10" (i.e., W1=1 and W0=0) at the output of Waveform Memory 54. This happens at $t=t_1$. However, as the edge generator is still at the "0" level, nothing happens on output line 66. At $t=t_2$, the edge generator 62 produces a "1" state, such that both inputs of AND gate 60 are logic "1". The signal is now transmitted to the S input of RS flip-flop 65, such that its Q output enters the "1" state, as indicated by reference number 67. Similar considerations apply to the other waveform instructions depicted in FIG. 5. The output waveform of FIG. 5h thus corresponds exactly to the waveform instructions stored in Vector Memory 54, as a comparison between FIGS. 5b and 5h may reveal. However, it will be noted that the output signal OUT is slightly shifted in time. This is caused by the time delay $\Delta T$ of the edge generator. Thus, by shifting the signal produced by edge generator 62 in time (cf. fine delay stage 14 in FIG. 1), the output signal OUT may be shifted in time as well.

A more sophisticated, but still simplified embodiment is shown in FIGS. 6 and 7a–7i. These figures depict control of a data formatter and a tri-state formatter, but not of the receiver components such as the edge comparator or the window formatter. However, the latter components are controlled in similar manner, as will now be explained by means of FIGS. 6 and 7a–7i and Tables 4–6 as shown below.

TABLE 4

CODING TABLE

| WAVEFORM | CODE | | | |
|---|---|---|---|---|
| DRIVE 0 AT EG0 | 0 | 0 | 0 | 0 |
| DRIVE 0 AT EG1 | 0 | 0 | 0 | 1 |
| DRIVE 1 AT EG0 | 0 | 0 | 1 | 0 |
| DRIVE 1 AT EG1 | 0 | 0 | 1 | 1 |
| HOLD | 0 | 1 | 0 | 0 |
| DRIVE HZ AT EG0 | 0 | 1 | 0 | 1 |
| DRIVE HZ AT EG1 | 0 | 1 | 1 | 0 |
| DRIVE NON-HZ AT EG0 | 0 | 1 | 1 | 1 |
| DRIVE NON-HZ AT EG1 | 1 | 0 | 0 | 0 |
| DRIVE 1 AT EG0, drive 0 AT EG 1 | 1 | 0 | 0 | 1 |

TABLE 5

WAVEFORM MEMORY

| ADDRESS | | | | DATA | | | | | | | |
|---|---|---|---|---|---|---|---|---|---|---|---|
| 0 | 0 | 0 | 0 | 0 | 0 | 1 | 0 | 0 | 0 | 0 | 0 |
| 0 | 0 | 0 | 1 | 0 | 0 | 0 | 1 | 0 | 0 | 0 | 0 |
| 0 | 0 | 1 | 0 | 1 | 0 | 0 | 0 | 0 | 0 | 0 | 0 |
| 0 | 0 | 1 | 1 | 0 | 1 | 0 | 0 | 0 | 0 | 0 | 0 |
| 0 | 1 | 0 | 0 | 0 | 0 | 0 | 0 | 0 | 0 | 0 | 0 |
| 0 | 1 | 0 | 1 | 0 | 0 | 0 | 0 | 1 | 0 | 0 | 0 |
| 0 | 1 | 1 | 0 | 0 | 0 | 0 | 0 | 1 | 0 | 0 | 0 |
| 0 | 1 | 1 | 1 | 0 | 0 | 0 | 0 | 0 | 1 | 0 | 0 |
| 1 | 0 | 0 | 0 | 0 | 0 | 0 | 0 | 0 | 0 | 0 | 1 |
| 1 | 0 | 0 | 1 | 1 | 0 | 0 | 1 | 0 | 0 | 0 | 0 |

TABLE 6

| VECTOR MEMORY | | | | | | | | |
|---|---|---|---|---|---|---|---|---|
| ADDRESS | | | | DATA | | | | (WAVEFORM) |
| 0 | 0 | 0 | 0 | 0 | 1 | 0 | 0 | HOLD |
| 0 | 0 | 0 | 1 | 0 | 1 | 0 | 0 | HOLD |
| 0 | 0 | 1 | 0 | 0 | 0 | 1 | 0 | DRIVE 1 @ EG0 |
| 0 | 0 | 1 | 1 | 0 | 1 | 0 | 0 | HOLD |
| 0 | 1 | 0 | 0 | 0 | 0 | 0 | 0 | DRIVE 0 @ EG0 |
| 0 | 1 | 0 | 1 | 0 | 1 | 0 | 0 | HOLD |
| 0 | 1 | 1 | 0 | 0 | 0 | 1 | 0 | DRIVE 1 @ EG0 |
| 0 | 1 | 1 | 1 | 0 | 0 | 0 | 1 | DRIVE 0 @ EG1 |
| 1 | 0 | 0 | 0 | 0 | 1 | 0 | 0 | HOLD |
| 1 | 0 | 0 | 1 | 0 | 0 | 0 | 1 | DRIVE 1 @ EG0 drive 0 @ EG1 |
| 1 | 0 | 1 | 0 | 1 | 0 | 0 | 1 | DRIVE 1 @ EG0 drive 0 @ EG1 |
| 1 | 0 | 1 | 1 | 0 | 1 | 0 | 0 | HOLD |
| 1 | 1 | 0 | 0 | 0 | 1 | 1 | 0 | DRIVE HZ @ EG1 |
| 1 | 1 | 0 | 1 | 0 | 1 | 0 | 0 | HOLD |
| 1 | 1 | 1 | 0 | 0 | 1 | 1 | 1 | DRIVE NON-HZ @ EG0 |
| 1 | 1 | 1 | 1 | 0 | 1 | 0 | 0 | HOLD |

Figure 6:
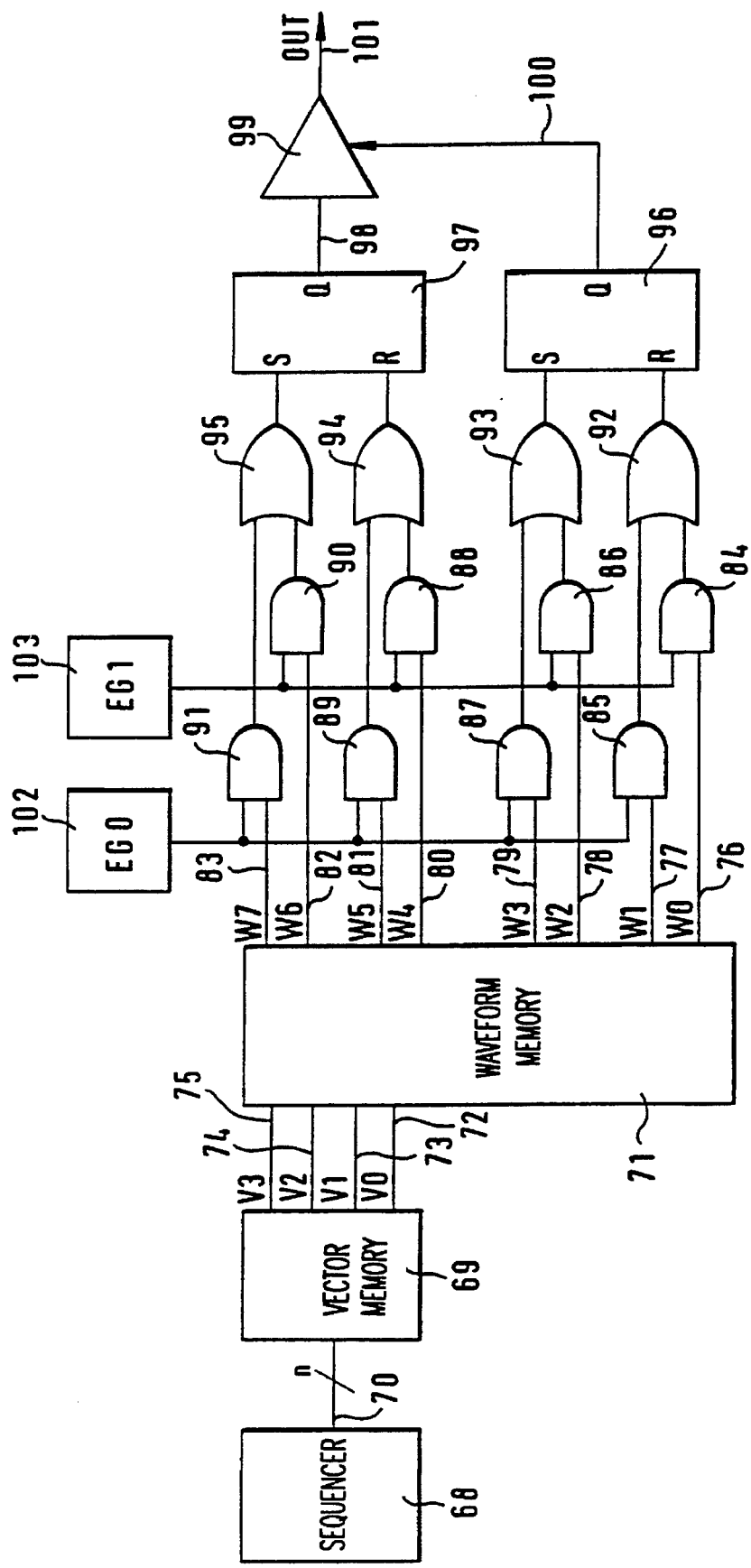
FIG. 6 is a more sophisticated, but still simplified circuitry for practicing the present invention.

In the circuit of FIG. 6, the sequencer 68 is connected with the Vector Memory 69 via four address lines 70 (it will be appreciated that the number of address lines is usually considerably higher; however, as the embodiment of FIGS. 6, 7a–7i and Tables 4–6 shows only 16 steps in a test sequence, four address lines are sufficient). The Vector Memory 69 is, in turn, connected with the Waveform Memory 71 via four connection lines 72–75 labelled as V0–V3.

The outputs of Waveform Memory 71 (lines 76–83) are labelled as W0 through W7. Four of them, namely signals W0–W3, control the tri-state formatter branch, whereas signals W4–W7 control the data formatter branch. As the example of FIG. 6 shows, Waveform Memory 71 has now in fact more data output lines (namely eight) than address input lines (namely four). In high-performance applications, there will be provided about 70 data output lines (but still only a few address input lines).

The data output signals W0–W7 of Waveform Memory 71 are fed to respective AND gates 84–91. Each of OR gates 92–95 combines two outputs of the AND gates. OR gates 92 and 93 control the inputs of RS flip-flop 96, and OR gates 94 and 95 control the inputs of RS flip-flop 97.

The Q output of RS flip-flop 97 constitutes the data signal which is fed—via line 98—to a tri-state buffer 99. Its tri-state input (line 100) is controlled by the Q output of RS flip-flop 96. The output signal of tri-state buffer 99 constitutes the output signal OUT on line 101. Therefore, RS flip-flop 97 effectively controls the data level, whereas RS flip-flop 96 controls the tri-state (HZ) condition of the output signal.

The circuit of FIG. 6 uses two edge generators EG0 and EG1 (see reference numbers 102 and 103). The output of edge generator EG0 (reference number 102) is fed to the inputs of AND gates 85, 87, 89 and 91, whereas the signal generated by edge generator EG1 (reference number 103) is fed to inputs of AND gates 84, 86, 88 and 90.

Operation of the circuit in FIG. 6 will now be explained by means of an example. Consider output W7 of Waveform Memory 71 together with edge generator EG0, and AND gate 91. As soon as both input signals are provided to this AND gate, it will set RS flip-flop 97 (the signal generated by AND gate 91 is transmitted by OR gate 95), such that output W7 of Waveform Memory 71 corresponds to the waveform instruction "drive output signal to 1 when edge generator EG0 is in its high state" or, in a shorter notation, "Drive 1 at EG0". In contrast, signal W6 drives the output signal to 1 in dependence of edge generator EG1.

In similar manner, output signals W4 and W5 of Waveform Memory 71 drive the output to 0 in dependence of edge generators EG0 and EG1, respectively.

Operation of the tri-state formatter branch is similar to the data formatter branch. In particular, signals W2 and W3 are used to have the output signal enter its high-impedance state by setting RS flip-flop 69 in dependence of edge generators EG1 and EG0, respectively. In similar manner, signals W0 and W1 reset RS flip-flop 69 and thus finish the high-impedance state of output signal OUT.

The circuit of FIG. 6 is able to support a variety of different formats. Some of them are shown in the coding table 4. The first four lines in this table are the basic commands required to drive the data signal, namely "Drive 0" and "Drive 1" in dependence of edge generators EG0 and EG1, respectively. The fifth line represents the "Hold" command, i.e. nothing is changed. Lines 6–9 are the corresponding basic commands for control of the tri-state formatter branch.

However, it has to be noted that the circuit of FIG. 6 enables the user to define more complex waveform instructions as well. One example (out of many possible) has been listed in the last line of Table 4, namely to drive the signal to "1" at EG0 and to drive it to "0" at EG1. It will be appreciated that the user may define other combined waveform instructions as well. This is a very particular advantage of the present invention.

Table 4 assigns a code to each of the waveform instructions. This code may be defined arbitrarily; the coding scheme of Table 4 is only an example.

The contents of Waveform Memory 71 are listed in Table 5. For example, the "Drive 1 at EG0" command (address 0010 of the Waveform Memory, see third line in Table 5) produces the output "1000 0000" at the data outputs of Waveform Memory 71. That is, signal W7 is "high", and the others are "low". Thus, as soon as edge generator EG0 produces a "high" state, RS flip-flop 97 is set so that the output signal OUT is driven to 1.

Table 6 shows an arbitrary sequence of waveform instructions stored in Vector Memory 69. It is understood that this is a quite short test sequence used for illustrative purposes only.

Figures 7A, 7B, 7C, 7D:
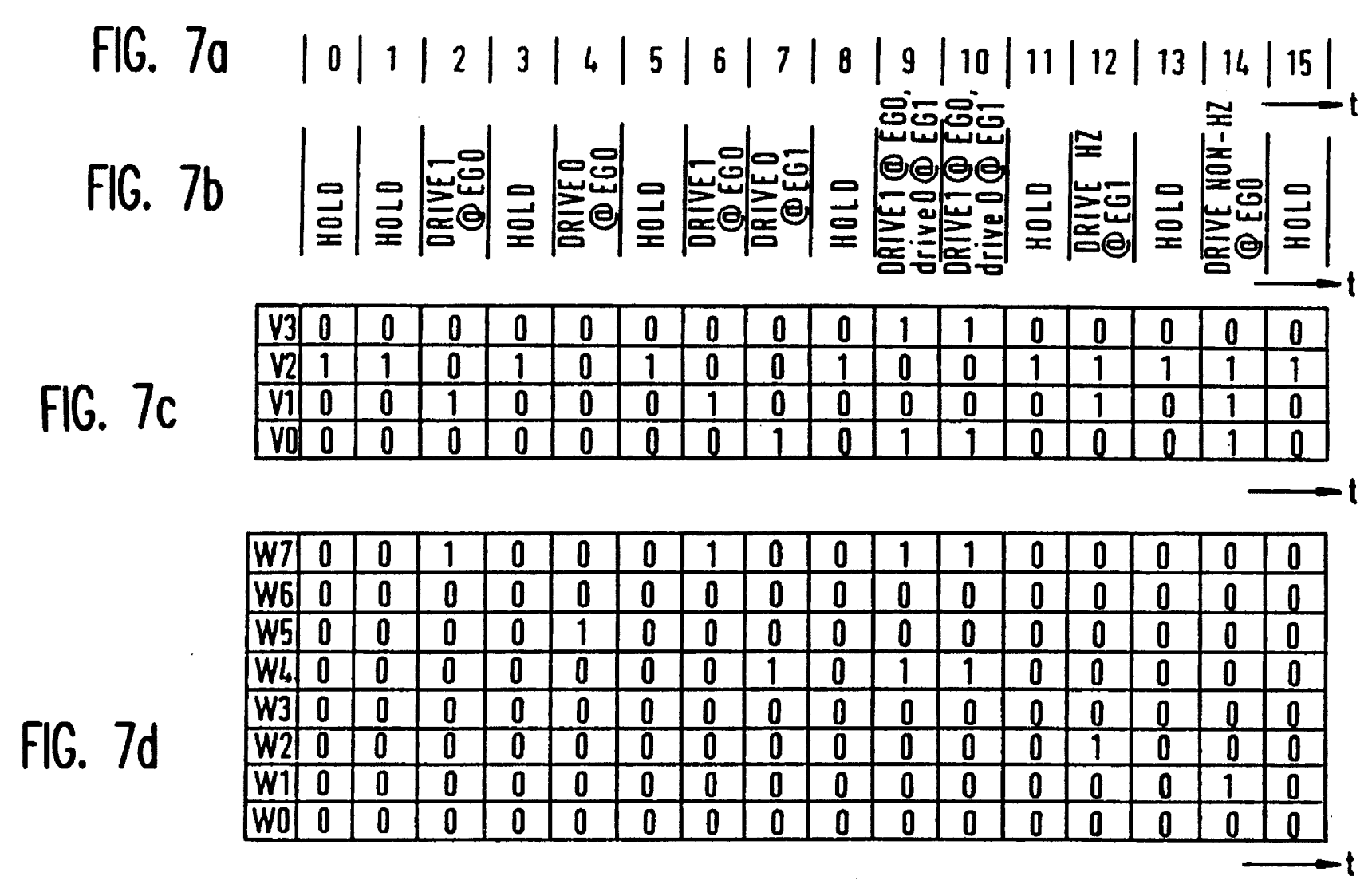

FIGS. 7a–7i depicts operation of the circuit in FIG. 6 using the test sequence of Table 6. FIG. 7a shows the sequencer address in decimal notation (the horizontal axis corresponds to time, as in FIG. 5). FIG. 7b is the symbolic waveform instruction contained in Vector Memory 69. The actual contents of the memory cells of the Vector Memory are shown in FIG. 7c and FIG. 7d shows the outputs of Waveform Memory 71 in response to a waveform code applied to its address inputs by Vector Memory 69.

The signal generated by edge generator EG0 (reference number 102) is depicted in FIG. 7e, and the corresponding output of edge generator EG1 in FIG. 7f. It will be noted that the two edge generator signals are slightly shifted in time, as indicated by time shift ΔT.

FIGS. 7g and 7h represent the signals on lines 98 and 100, respectively, i.e. the Q outputs of RS flip-flops 97 and 96. FIG. 7i is the output signal OUT on line 101.

It will be noted that pulses may be generated in similar manner as in the environment of FIG. 5. However, there is the possibility of shifting a pulse in time by using either of the two edge generators, or of varying the duration of a pulse. For example, pulse 104 (FIG. 7i) extends beyond a rising edge at EG0 and a falling edge at EG1, such that its duration is not a multiple of the timing between pulses of a single edge generator.

A further example of the increased capabilities of the circuit in FIG. 6 is the generation of small "needle" pulses 105 and 106. The combined waveform instruction (last line in the table of Table 4) is used to generate these pulses. The rising edge of pulse 105 (at $t=t_1$) is controlled by a transition of edge generator EG0, whereas its falling edge at $t=t_2$ depends on the signal of edge generator EG1. By varying the time shift $\Delta t$ between the two edge generators, the duration of needle pulses 105 and 106 may be altered.

At $t=t_3$, the tri-state formatter branch is activated. Therefore, the output signal floats between $t=t_3$ and $t=t_4$. During this time period, the logic state on line 98 does not influence the output signal.

I claim:

1. Apparatus for generating test signals, comprising:

first circuit means for generating address signals;

first memory means for storing test vector signal patterns that define a waveform code or an action code, said first memory means having at least one address input connected to at least one output of said first circuit means and responsive to an address signal from said first circuit means to provide a test vector signal pattern output corresponding to said address signal;

second circuit means for providing a format signal to a device under test and receiving data signals from a device under test;

at least one edge generator for generating at an output, signal transitions that are substantially equidistant, the output of said edge generator connected to an input of said second circuit means; and second memory means including stored formatter control signals, interconnected between said first memory means and said second circuit means, said second memory means responsive to said test vector signal pattern that is output from said first memory means, to output a corresponding stored formatter control signal, said second circuit means responsive to said corresponding stored formatter control signal when said second circuit means receives a signal transition from said edge generator.

2. Apparatus according to claim 1, wherein said formatter control signal from said second memory means defines a waveform for said format signal to be generated by said second circuit means.

3. Apparatus according to claim 1, wherein said second circuit means comprises an output driver and a data formatter that is responsive to said signal transition from said edge generator to provide, via said output driver, said format signal.

4. Apparatus according to claim 1, wherein said second circuit means comprises an output driver and a tri-state formatter that is responsive to said corresponding formatter control signal to control said output driver to either transmit to said device under test said format signal or to manifest a high impedance output state.

5. Apparatus according to claim 1, wherein said second circuit means comprises an edge comparator that is responsive to an output from said second memory means to determine if a data signal received from said device under test is an expected signal at a specific point in time.

6. Apparatus according to claim 5, wherein said second circuit means further comprises a window formatter that is responsive to said output from said second memory means to provide a window signal to said edge comparator to enable said edge comparator, during a time of said window signal, to respond to a signal from a device under test.

7. Apparatus according to claim 1, wherein said second circuit means comprises at least one flip-flop.

8. Apparatus according to claim 1, wherein said first memory means comprises an algorithmic pattern generator.

9. Apparatus according to claim 1, wherein said second memory means is programmable to enable alteration of said corresponding stored formatter control signal.

10. Apparatus according to claim 1, wherein said at least one edge generator is a static edge generator.

11. Apparatus according to claim 1, wherein said second memory means is integrated in an integrated circuit, together with said second circuit means.

12. Apparatus according to claim 1, wherein said second memory means includes substantially less inputs for receiving test vector signal patterns than outputs for providing stored formatter control signals.

* * * * *

UNITED STATES PATENT AND TRADEMARK OFFICE
CERTIFICATE OF CORRECTION

PATENT NO. : 5,453,995
DATED : September 26, 1995
INVENTOR(S) : Behrens

It is certified that error appears in the above-indentified patent and that said Letters Patent is hereby corrected as shown below:

Claim 7, Col. 16, line 30, after "flip flop", insert -- for producing bi-level outputs --.

Claim 8, Col. 16, line 32, after "generator" insert -- for generating test sequences for a device under test --.

Signed and Sealed this

Twenty-seventh Day of August, 1996

Attest:

BRUCE LEHMAN

Attesting Officer  Commissioner of Patents and Trademarks